United States Patent
Kang

(10) Patent No.: US 7,167,211 B2
(45) Date of Patent: Jan. 23, 2007

(54) APPARATUS AND METHOD FOR A/D CONVERSION IN A DIGITAL VIDEO SYSTEM

(75) Inventor: Ho-woong Kang, Yongin (KR)

(73) Assignee: Samsung Electronics Co., Ltd., Gyunggi-do (KR)

( * ) Notice: Subject to any disclaimer, the term of this patent is extended or adjusted under 35 U.S.C. 154(b) by 558 days.

(21) Appl. No.: 10/639,584

(22) Filed: Aug. 13, 2003

(65) Prior Publication Data

US 2004/0032530 A1  Feb. 19, 2004

(30) Foreign Application Priority Data

Aug. 13, 2002  (KR) ............................. 2002-47753

(51) Int. Cl.
*H03M 1/12* (2006.01)
(52) U.S. Cl. ...................................... 348/572; 348/571
(58) Field of Classification Search ............. 348/572, 348/571; 341/126, 155, 158, 160, 166; *H03M 1/12*
See application file for complete search history.

(56) References Cited

U.S. PATENT DOCUMENTS

| | | | | | |
|---|---|---|---|---|---|
| 4,990,914 | A | * | 2/1991 | Giancarlo | 341/143 |
| 5,329,282 | A | * | 7/1994 | Jackson | 341/143 |
| 5,719,638 | A | * | 2/1998 | Noda | 348/572 |
| 6,002,445 | A | * | 12/1999 | Urayama | 348/572 |
| 6,703,958 | B2 | * | 3/2004 | Noro | 341/155 |
| 6,989,871 | B2 | * | 1/2006 | Saito | 348/572 |

* cited by examiner

*Primary Examiner*—Trang U. Tran
(74) *Attorney, Agent, or Firm*—Sughrue Mion, PLLC

(57) ABSTRACT

An A/D conversion apparatus of a digital video system includes an A/D converter for converting an input analog video signal to a digital signal on the basis of a reference voltage value input from the outside and outputting the digital signal; and a reference voltage supplying portion for supplying the A/D converter with a predetermined number of the reference voltage value sequentially and repeatedly during a predetermined time period. Accordingly, since the quantization error can be minimized during the A/D conversion in the digital video system without increasing the number of the quantization bits, the image quality can be improved.

14 Claims, 6 Drawing Sheets

APPARATUS AND METHOD FOR A/D CONVERSION IN A DIGITAL VIDEO SYSTEM

BACKGROUND ON THE INVENTION

1. Field of the Invention

The present invention relates to an apparatus and a method for A/D conversion in a digital video system, and more particularly, to an apparatus and a method for A/D conversion in a digital video system to minimize a quantization error without increasing the number of quantization bits during the A/D conversion, thereby improving an image quality. The present application is based on Korean Patent Application No. 2002-47753, which is incorporated herein by reference.

2. Description of the Prior Art

A digital video system such as a digital TV (DTV) requires an analog to digital conversion (A/D conversion) for displaying an image on a screen.

The A/D conversion is a process of converting a continuously changing analog video signal or audio signal to a discrete digital signal. A sampling frequency and the number of quantization bits in the A/D conversion affect an image quality, a sound quality, and an amount of information of the digital video system. That is, an increased sampling frequency guarantees an excellent video and audio quality because a denser sampling enables a high frequency to be reproduced. However, in proportion to the increased sampling frequency, an amount of the information to be transmitted and recorded typically increases as much as the sampling frequency.

The number of the quantization bits corresponding to one sample also affects the video and sound quality, and the amount of the information. For example, a mosaic image is widely used for purposes such as rights of portrait protection, and is expressed too fuzzy for a viewer to recognize an actual image. That is caused by the decreased amount of the quantization bits in a digital signal processing.

The quantization in the A/D conversion is the process of manipulating continuously distributed sample values to represent a discrete set of numerical values, which inevitably causes the loss of information. For example, if a quantization step width is 1V, an output value is obtained by rounding-off an input value in a manner that an input signal value of 0.5 V and below becomes 0V, 0.5V~1.5V becomes 1V, and 1.5V~2.5V becomes 2V. That is, when the continuous analog signal is converted to the discrete signal in a stepped fashion, there inevitably occurs an error between the input signal and the output signal. This error is called a quantization error. Also, the quantization error is referred to as a quantization noise, because it appears in the form of a noise with respect to a signal.

The quantization error does not exceed a half of the quantization step width, and is reduced as the quantization step width is decreased. In other words, decreasing the quantization step width increases the number of the quantization bits. However, since there is a limit to increasing the number of the quantization bits, the quantization error cannot be reduced to substantially zero(0). That is, the more the quantization bits are increased, the narrower the quantization step width becomes, which results in the improved video and audio quality, but also the increased amount of the information in proportion to the number of the quantization bits. Accordingly, the number of quantization bits has to be increased properly.

Due to this technological restriction, acoustic apparatuses, which have a relatively smaller amount of information, have been digitalized ahead of image apparatuses. A typical digital acoustic apparatus such as a CD has a sampling frequency of 44.1 kHz and quantization bits of 16-bits. In the case of a motion picture signal, a bandwidth of which is 200 times as much as an audio signal, if the number of quantization bits is equal to or greater than 16-bits, the amount of the information reaches astronomical figures, and thus, it is practically impossible to convert or record an image signal to a digital code. Accordingly, the number of quantization bits in the digital video system has to be determined in consideration of costs, visual characteristics of human eyes, and the level of image quality personally evaluated by viewers with respect to an actual screen as having no problem. Generally, the number of quantization bits is 8-bits or 10-bits, and recently, a digital processor camera of 12-bits has been developed.

The resolution of 8-bits is $2^8$ level (=256) at a maximum, the resolution of 10-bits is $2^{10}$ level (=1024) at a maximum, and the resolution of 12-bits is $2^{12}$ level (=4096) at a maximum. The 8-bit system has the quantization step width larger than that of a 10-bit system so that an amount of the information to be processed is much smaller, but the 8-bit system has a difficulty in depicting an obliquely shaped object such as an oblique line or an arc shape as precisely as an analog system.

Accordingly, in order to obtain high video and audio quality in the digital video system, it is required to increase the number of the quantization bits and thus decrease the quantization step width. However, since increasing the number of quantization bits results in an increased amount of information, there are problems of complicated circuit structure and increased fabrication costs.

For the above reason, the digital video system generally employs the 8-bit system. In this case, the digital video system uses an 8-bit quantized level with respect to a luminance (Y) signal and a color difference signal (Cb, Cr) that are required to express a picture element or a pixel corresponding to one point in a screen, as well as quantization bits of 8-bits.

Accordingly, an A/D conversion apparatus of a digital video system is required to minimize the quantization error and thus improve the image quality without having to increase the number of the quantization bits during the A/D conversion and causing an increased complexity of circuit requirements or fabrication cost, when the quantization level of the luminance (Y) or the color difference signal (Cb, Cr) for expressing the pixel is greater than 8-bits.

SUMMARY OF THE INVENTION

The present invention has been developed in order to solve the above problem in the prior art. Accordingly, it is an object to provide an A/D conversion apparatus of a digital video system capable of minimizing a quantization error without having to increase the number of quantization bits during an A/D conversion process for converting an analog video signal to a digital signal, thereby improving an image quality.

The above object of the present invention is achieved by providing an A/D conversion apparatus of a digital video system, comprising: an A/D converter for converting an input analog video signal to a digital signal on the basis of a reference voltage value input from the outside and outputting the digital signal; and a reference voltage supplying portion for supplying the A/D converter with a predetermined number (M) of the reference voltage value sequentially and repeatedly during a predetermined time period, wherein the M of the reference voltage value is obtained by the following equation:

$$V_{REF} = \sum_{i=0}^{M-1} \frac{\Delta}{M} i$$

where $V_{REF}$ is the reference voltage value, and $\Delta$ is a quantization step width used during the A/D conversion.

Preferably, the predetermined time period is a horizontal scan period or a vertical scan period, and the analog video signal is a video signal of an interlaced scan method or a video signal of a progressive scan method. Also, it is preferred that the M is 2 or 4.

An A/D conversion method of a digital video system according to the present invention comprises the steps: (a) converting an input analog video signal to a digital signal on the basis of a reference voltage value input from the outside and outputting the digital signal; and (b) supplying the (a) step with a predetermined number (M) of the reference voltage value(s) sequentially and repeatedly during a predetermined time period, wherein the M is obtained by the following equation:

$$V_{REF} = \sum_{i=0}^{M-1} \frac{\Delta}{M} i$$

where $V_{REF}$ is the reference voltage value, and $\Delta$ is a quantization step width used during the A/D conversion.

Preferably, the predetermined time period is a horizontal scan period or a vertical scan period, and the analog video signal is a video signal of an interlaced scan method or a video signal of a progressive scan method. Also, it is preferred that M is 2 or 4.

BRIEF DESCRIPTION OF THE DRAWINGS

The above object and a feature of the present invention will be more apparent by describing preferred embodiments of the present invention with reference to the accompanying drawings, in which.

DETAILED DESCRIPTION OF THE PREFERRED EMBODIMENT

Hereinafter, the present invention will be described in greater detail with reference to the accompanying drawings.

Figure 1:
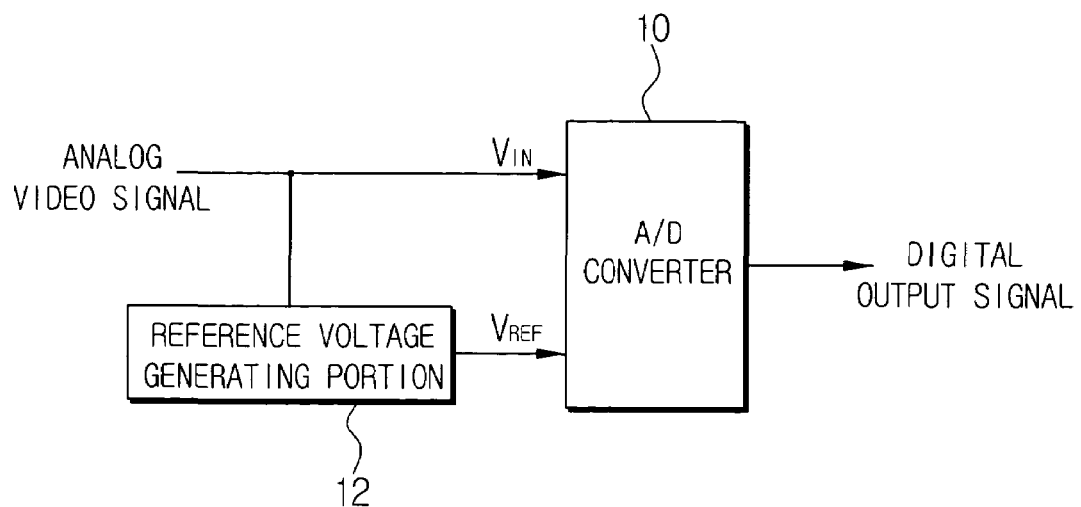
FIG. 1 is a schematic block diagram showing an A/D conversion block diagram of a digital video system according to the present invention.

FIG. 1 is a schematic block diagram showing an A/D conversion apparatus of a digital video system according to the present invention. The A/D conversion apparatus of the digital video system comprises an A/D converter 10 and a reference voltage-generating portion 12.

Referring to FIG. 1, the A/D converter 10 converts an input analog video signal to a digital signal and outputs the encoded digital signal. The reference voltage-generating portion 12 supplies a reference voltage value (VREF) that is used as a reference voltage when the A/D converter 10 converts the input analog video signal to the digital signal.

Figure 2:
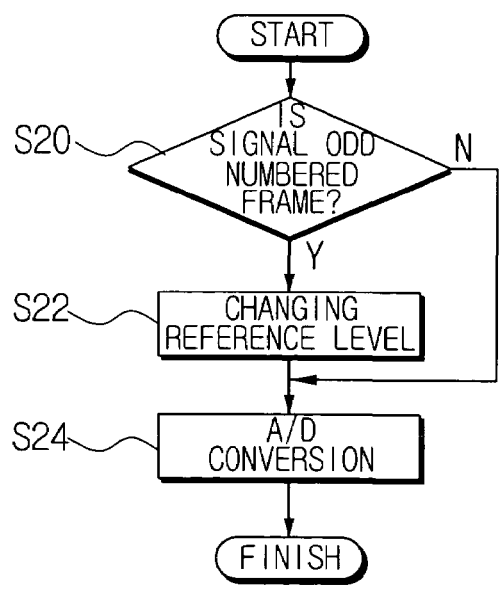
FIG. 2 is a flowchart showing a method of operating the A/D conversion apparatus of the digital video system of FIG. 1.

FIG. 2 is a flow chart illustrating a method of operating the A/D conversion apparatus of the digital video system of FIG. 2.

Figure 3:
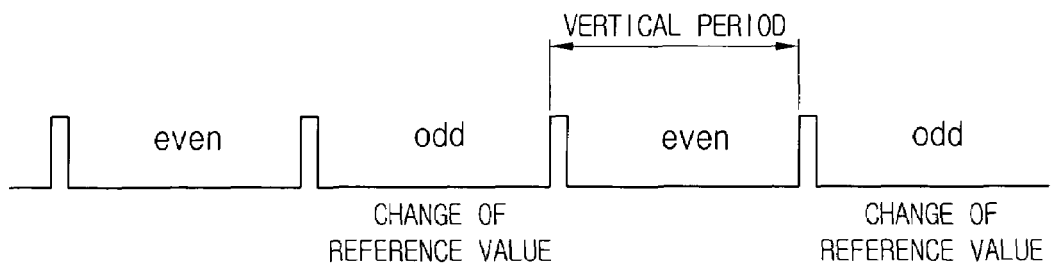
FIG. 3 is a view showing an operational principle of the A/D conversion apparatus of the digital video system of FIG. 1.

In this embodiment, it is assumed that an analog video signal input to the A/D converter 10 is a video signal of a progressive scan method or a non-interlaced scan method for the convenience of descriptions. The progressive scan method is used in a computer monitor and a digital TV and presents one screen in the basis of a frame unit, i.e., displays the total frames all together in a similar manner of projecting a film onto a screen. FIG. 3 illustrates video signals of an even numbered frame and an odd numbered frame that are continuously input according to a vertical synchronization signal. In the case of the analog video signal of the progressive scan method, the reference voltage generating portion 12 determines whether the input analog video signal is the odd numbered frame video signal or not (S20). If it is determined that the analog signal is the odd numbered frame video signal, a reference level of a sampling is changed. The 'change of the reference level' means that the reference voltage value VREF, which the reference voltage generating portion 12 supplies to the A/D converter 10, is either increased or decreased. A value by which the reference voltage value VREF is increased or decreased corresponds to an approximate half of the quantization step width used during the A/D conversion on the basis of an initially set reference voltage value.

If the input analog video signal is an even numbered frame video signal, the A/D conversion is performed on the basis of the initially set reference voltage value (S24). The steps of S20, S22 and S24 are repeatedly performed. Also, whether the signal is an odd numbered frame video signal or an even numbered frame video signal is determined by the detection of the vertical synchronization signal, i.e., the first detected signal is regarded as the odd numbered frame video signal and the next detected signal is regarded as the even numbered frame video signal, and so on.

Figure 4A:
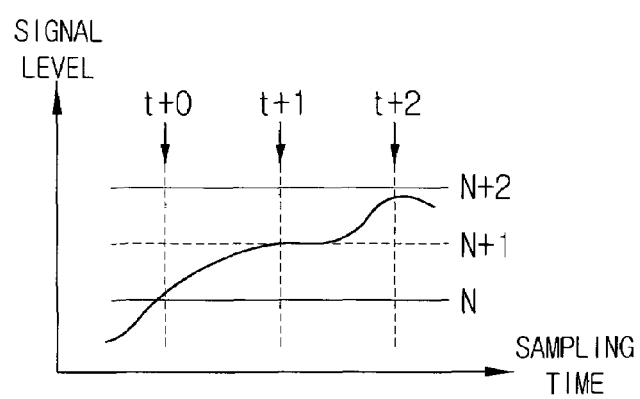
FIGS. 4A and 4B are views to explain an A/D conversion process.
Figure 4B:
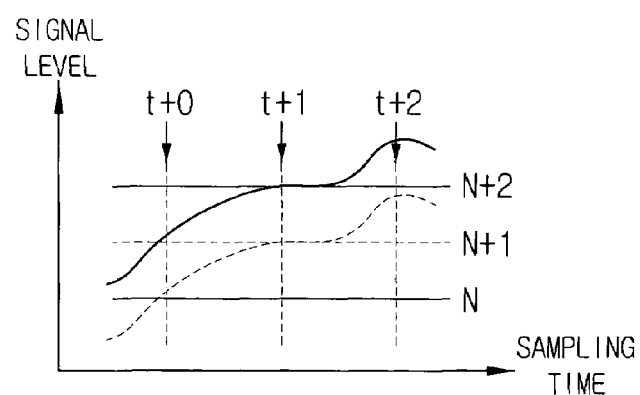

An effect of the A/D conversion according to the above-described method will be explained below. FIGS. 4A and 4B are views showing a digital value output from the A/D converter 10 when the reference level is changed during the A/D conversion. FIG. 4A illustrates the A/D conversion when it is performed on the basis of the initially set reference voltage value. A sampled digital value and a quantization error generated each time t+0, t+1, and t+2 in FIG. 4A are expressed in the following table 1.

TABLE 1

| Sampling Time | t + 0 | t + 1 | t + 2 |
|---|---|---|---|
| Digital Value | N | N + 1 | N + 1 |
| Quantization Error | 0.1 | 0 | 0.6 |

FIG. 4B illustrates the A/D conversion when the reference level of the sampling is changed with respect to the odd numbered frame video signal. This case is that the reference voltage value is increased, and a solid-line in FIG. 4B illustrates a waveform generated when the sampling is performed with the reference voltage value being increased, and a dotted line illustrates a waveform generated when a sampling is performed without the change of the reference voltage value. A sampled digital value and a quantization error generated each time t+0, t+1, and t+2 in the waveform illustrated by the solid-line are expressed in the following table 2.

TABLE 2

| Sampling Time | t + 0 | t + 1 | t + 2 |
|---|---|---|---|
| Digital Value | N + 1 | N + 2 | N + 2 |
| Quantization Error | 0.1 | 0 | 0.6 |

Figure 5:
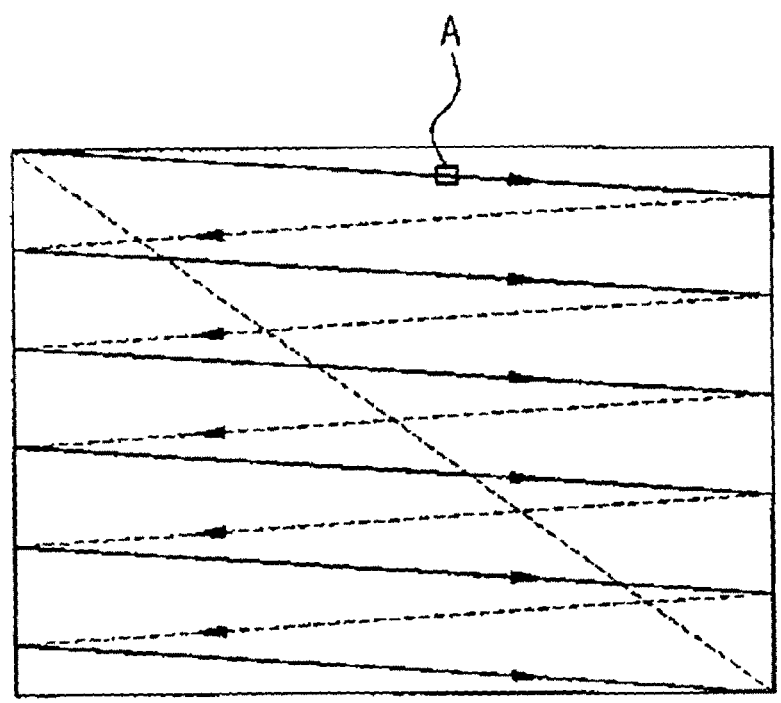
FIG. 5 is a view to explain an effect of an A/D conversion apparatus of a digital video system according to the present invention.

Referring to the tables 1 and 2, the sampled value at the time t+0 is N when there is no change in the reference voltage value, and is N+1 when the reference voltage value is increased. If it is assumed that the digital values calculated according to the above tables are used as a luminance value Y level of a specific picture element A on a screen as shown in FIG. 5, the luminance value Y level of the picture element A is expressed first by N and next by N+1, and so on. That is, the luminance value Y level of the picture element A repeats the changes from N to N+1, and the changes of the brightness value are rapidly made according to the vertical synchronization signal. Accordingly, a viewer does not recognize the picture element A flashing onto the screen, i.e., the luminance value Y of the picture element A changing from N to N+1, but perceives the picture element A as the luminance value Y maintains N+0.5 which corresponds to an approximate middle value of N and N+1. Without having to increase the number of quantization bits in the A/D conversion, the A/D conversion according to the above-described method enables an improved visual quality similar to the effect obtained when the number of quantization bits is increased.

Although this embodiment has been described based on the assumption that the input analog video signal is generated in the progressive scan method for the convenience of descriptions, an input analog video signal generated in an interlaced scan method results in the same image quality improvement effect. That is, in the case of odd numbered odd field and even field, the A/D conversion is performed without changing the reference level, and in the case of even numbered odd field and even field, the A/D conversion is performed with the reference level being changed. Also, the change of the reference level can be made by using a horizontal synchronization signal instead of the vertical synchronization signal or by compositely using the vertical synchronization signal and the horizontal synchronization signal. Also, although the reference level is changed in every second frame, various changing methods are possible, i.e., the reference level can be changed in every fourth frame or more.

Figure 6:
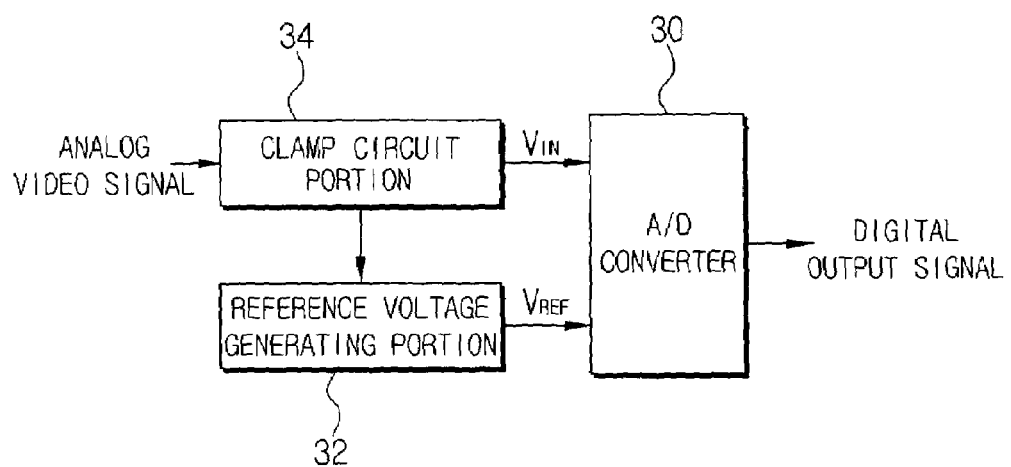
FIG. 6 is a block diagram showing an A/D conversion apparatus of a digital video system according to another embodiment of the preset invention.

FIG. 6 is a block diagram showing an A/D conversion apparatus of a digital video system according to another embodiment of the present invention. The basic operation of the A/D conversion apparatus is identical to that of the A/D conversion apparatus as shown in FIGS. 2 and 3. But, there is a difference in a method of generating a reference voltage value.

Referring to FIG. 6, the A/D conversion apparatus comprises an A/D converter 30, a reference voltage generating portion 32 and a clamp circuit portion 34.

The clamp circuit portion 34 clamps a reference level of an input analog video signal. The A/D converter 30 converts the analog video signal input through the clamp circuit portion 34 into a digital signal and outputs the digital signal.

On the basis of the reference level provided from the clamp circuit portion 34, the reference voltage generating portion 32 supplies a reference voltage value VREF that is used as a reference voltage when the A/D converter 10 converts the analog video signal into the digital output signal.

Figure 7A:
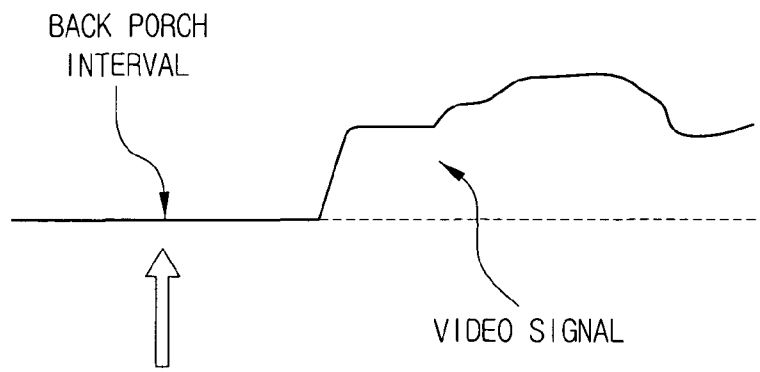
FIGS. 7A, 7B and 7C are views to explain a process of detecting a reference voltage value.

FIG. 7A illustrates an analog video signal input to the clamp circuit portion 34 by way of example. As shown in FIG. 7A, there exists a back porch interval in the analog signal.

That is, there is a blanking period i.e., a period where there is no video signal on a screen. For example, during the horizontal blanking period, a scan line of the screen is returned from the right side of the screen to the left side as shown in FIG. 5, which is referred to as a blanking period. An area from a backward end of a synchronization pulse of the video signal to a backward end of a blanking signal is referred to as the back porch interval. The reference voltage value is obtained by using a voltage value in the back porch interval, and the arrow in FIG. 7A indicates a clamp position.

Figure 7B:
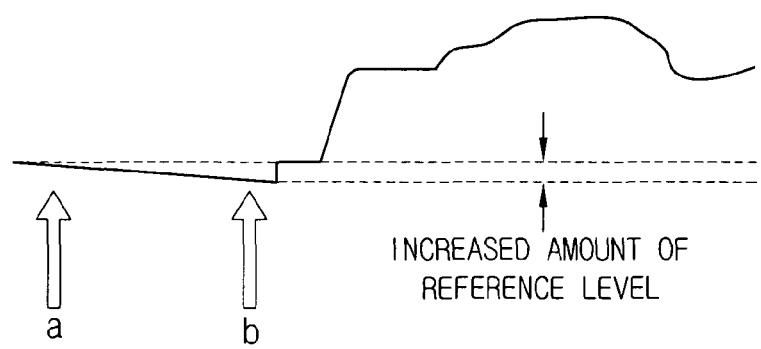

FIG. 7B illustrates a waveform generated when the video signal is minutely discharged in the back porch interval. As shown in FIG. 7B, a signal value in the back porch interval is decreased a little bit within a quantization step width. A value at a point "a" in the waveform of FIG. 7B is used as the reference voltage value when a reference value is not changed, while a value at a point "b" is used as the reference voltage value when a reference value is changed. When the values of points "a" and "b" are alternately supplied to the A/D converter 30 in every vertical scan period or horizontal scan period, the same effect of the changed reference level as described above can be obtained.

Figure 7C:
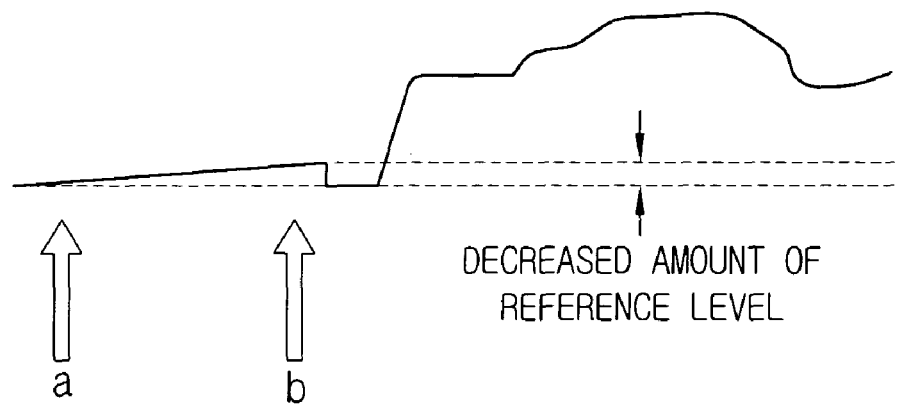

FIG. 7C illustrates a waveform generated when a video signal is minutely charged in the back porch interval. In this case, a signal value in the back porch interval is increased a little bit within a range of the quantization step width. As the same as described above, a value at a point "a" is used as the reference voltage value when a reference value is not changed, while a value at a point "b" is used as the reference voltage value when a reference value is changed. When the values of points "a" and "b" are alternately supplied to the A/D converter 30 in every vertical scan periods or horizontal scan periods, the same effect of the changed reference level as described above can be obtained.

Meanwhile, although two reference voltage values are used in the above embodiments, the use of more than two reference voltage values is also possible. For example, if the size of the quantization step width is 1, four reference voltage values which are obtained by increasing or decreasing as much as 0, ¼, 2/4 and ¾ on the basis of the reference voltage value are used such that the similar effect obtained as increasing the number of the quantization bit four times can be obtained. That is, in order to obtain the effect obtained as increasing the number of the quantization bits by M times, the M number of the reference voltage value(s) calculated by the following equation 1 is repeatedly used during a predetermined time period:

$$V_{REF} = \sum_{i=0}^{M-1} \frac{\Delta}{M} i \qquad \text{[Equation 1]}$$

where, $V_{REF}$ is the reference voltage value, $\Delta$ is a quantization step width used during the A/D conversion.

According to the present invention, the quantization error can be minimized during the A/D conversion in the digital video system without increasing the number of the quantization bit. Accordingly, the image quality can be improved with an inexpensive cost and a simplified circuit.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An A/D conversion apparatus of a digital video system, comprising:
   an A/D converter for converting an input analog video signal to a digital signal on the basis of a reference voltage value input from an external source and outputting the digital signal; and
   a reference voltage supplying portion for supplying the A/D converter with a predetermined number (M) of the reference voltage value sequentially and repeatedly during a time period, wherein the M of the reference voltage value is obtained by the following equation:

$$V_{REF} = \sum_{i=0}^{M-1} \frac{\Delta}{M} i$$

where VREF is the reference voltage value, and $\Delta$ is a quantization step width used during the A/D conversion.

2. The A/D conversion apparatus of claim 1, wherein the predetermined time period is a horizontal scan period.
3. The A/D conversion apparatus of claim 1, wherein the predetermined time period is a vertical scan period.
4. The A/D conversion apparatus of claim 1, wherein the analog video signal is a video signal of an interlaced scan method.
5. The A/D conversion apparatus of claim 1, wherein the analog video signal is a video signal of a progressive scan method.
6. The A/D conversion apparatus of claim 1, wherein the M is 2.
7. The A/D conversion apparatus of claim 1, wherein the M is 4.
8. An A/D conversion method of a digital video system, comprising the steps:
   (a) converting an input analog video signal to a digital signal on the basis of a reference voltage value input from an external source and outputting the digital signal; and
   (b) supplying the (a) step with a predetermined number (M) of the reference voltage values sequentially and repeatedly during a predetermined time period, wherein the M is obtained by the following equation:

$$V_{REF} = \sum_{i=0}^{M-1} \frac{\Delta}{M} i$$

where $V_{REF}$ is the reference voltage value, and $\Delta$ is a quantization step width used during the A/D conversion; and
   wherein the A/D conversion minimizes a quantization error without increasing the number of quantization bits during the A/D conversion.

9. The A/D conversion method of claim 8, wherein the predetermined time period is a horizontal scan period.
10. The A/D conversion method of claim 8, wherein the predetermined time period is a vertical scan period.
11. The A/D conversion method of claim 8, wherein the analog video signal is a video signal of an interlaced scan method.
12. The A/D conversion method of claim 8, wherein the analog video signal is a video signal of a progressive scan method.
13. The A/D conversion method of claim 8, wherein the M is 2.
14. The A/D conversion method of claim 8, where in the M is 4.

* * * * *